United States Patent [19]
Burton et al.

[11] Patent Number: 4,700,210
[45] Date of Patent: Oct. 13, 1987

[54] ASYMMETRIC CHIP DESIGN FOR LEDS

[75] Inventors: Randolph H. Burton, Somerset; Irfan Camlibel, Stirling; Robert H. Saul, Scotch Plains, all of N.J.

[73] Assignee: American Telephone and Telegraph Company, AT&T Bell Laboratories, Murray Hill, N.J.

[21] Appl. No.: 673,662

[22] Filed: Nov. 21, 1984

[51] Int. Cl.$^4$ .............................................. H01L 33/00
[52] U.S. Cl. ...................................... 357/17; 357/16; 357/55; 357/65; 357/68
[58] Field of Search ...................... 357/17, 65, 68, 16, 357/55, 45; 372/45

[56] References Cited

U.S. PATENT DOCUMENTS 4,415,414 11/1983 Burton et al. ...................... 204/129

OTHER PUBLICATIONS

Wada et al., "Performance and Reliability of High Radiance InGaAsP/InP DH LED's Operating in the 1.15–1.5 μm Wavelength Region", IEEE Journal of Quantum Electronics, vol. QE-18, No. 3, Mar. 1982, pp. 368–374.
Heinen et al., "High Radiance Surface-Emitting (In,-Ga)(As,P)/InP IREDs with an Emission Wavelength of 1.3 μm for Transmission Rates of 34 Mbit/s and 140 Mbit/s".
I. Camlibel et al., patent application Ser. No. 521,443, filed Aug. 8, 1983.

Primary Examiner—James W. Davie
Assistant Examiner—Georgia Y. Epps
Attorney, Agent, or Firm—Michael J. Urbano

[57] ABSTRACT

The area of a surface-emitting LED is reduced, and hence the number of LEDs which can be obtained from a single wafer is increased, by a chip design in which the light-emitting spot is positioned asymmetrically toward one corner of the chip. Preferably, an L-shaped contact is formed on the light output surface so that light-emitting spot emerges from between the legs of the L.

10 Claims, 2 Drawing Figures

FIG. 2

U.S. Patent  Oct. 13, 1987  Sheet 1 of 2  4,700,210
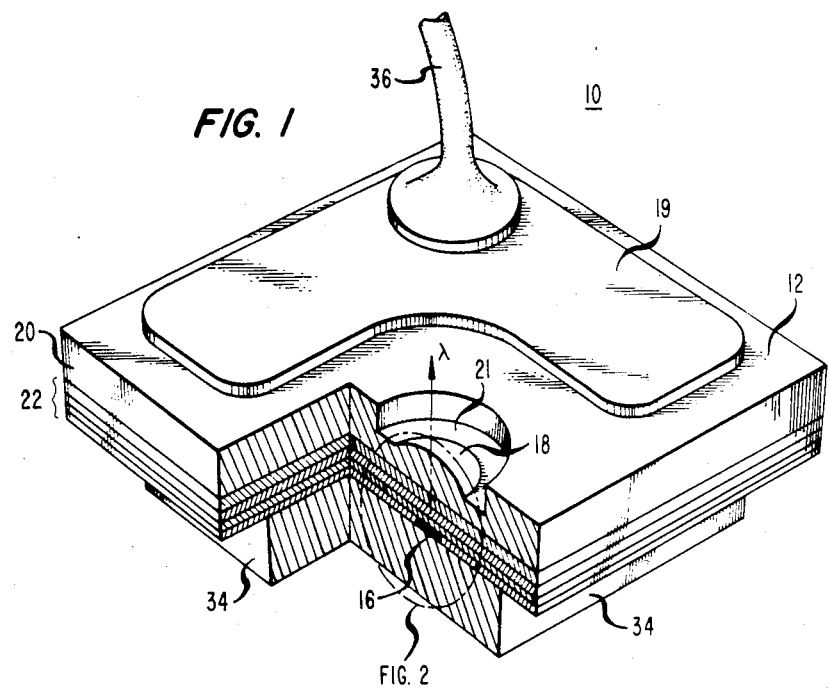

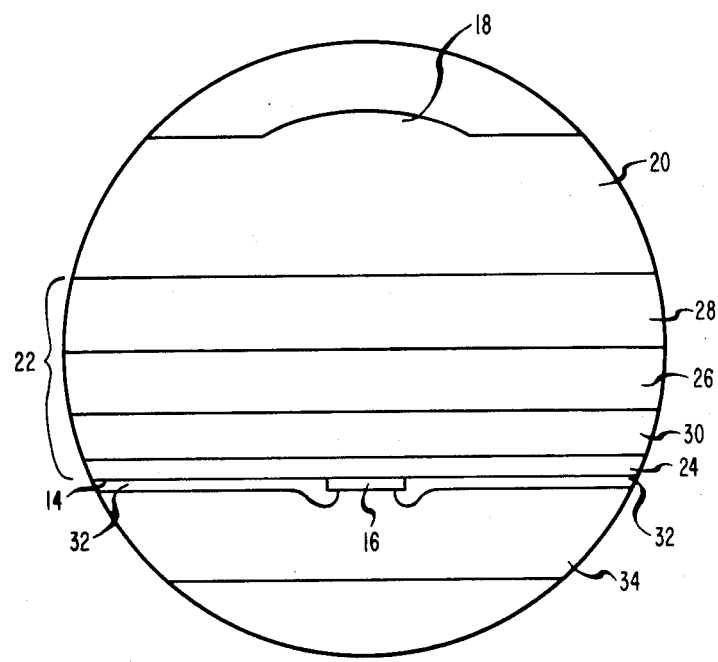

ASYMMETRIC CHIP DESIGN FOR LEDS

BACKGROUND OF THE INVENTION

This invention relates to light emitting diodes (LEDs) and, more particularly, to LEDs for use in lightwave systems.

In lightwave communication systems the light source is typically a diode laser or an LED which is coupled to an optical fiber. Information to be transmitted over the fiber is digitally encoded and used to pulse modulate the light intensity of the source. Depending upon the particular application, the bit rate of the system typically ranges from a few megabits per second to a few gigabits per second. In addition, the unrepeatered transmission path length of the system often dictates whether a laser or an LED is used. Lasers are usually found in long haul systems (e.g., hundreds of kilometers long) which require repeaters to regenerate and amplify the digital signal, whereas LEDs are common in short haul systems (e.g., a few tens of kilometers long or less) which do not require repeaters. One version of such short haul systems is known as an optical data link (ODL).

The design of lasers and LEDs for lightwave systems generally takes the form of a double heterostructure; e.g., an active, narrow bandgap layer sandwiched between and lattice-matched to a pair of opposite-conductivity-type, wider bandgap cladding layers. Under forward bias minority carriers are injected in the active region where they undergo radiative recombination to generate a light output at a wavelength related to the bandgap of the active layer. The direction of the light output depends on the device design. In lasers and edge-emitting LEDs light is extracted in a direction parallel to the active layer, and the output emerges from an end face (e.g., a cleaved facet) orthogonal thereto. On the other hand, in surface-emitting LEDs light is extracted in a direction perpendicular to the active region, and the output emerges from one of the cladding layers and/or from the substrate (if the latter is transparent at the wavelength of the generated light).

In order to couple light out of a surface-emitting LED, one major surface, say the bottom of the substrate, is typically provided with an annular electrical contact, and the opposite major surface is provided with a dot-shaped electrical contact in registration with the annulus. The dot contact restricts light emission to a correspondingly small area of the active region under the annulus, thereby enhancing the coupling efficiency, for example, to an optical fiber.

In common surface-emitting LEDs the dot contact is positioned in the center of the chip, which is typically a square parallelipiped. Illustratively, the major surfaces of the chip are about 22 mils square (480 square mils) and about 1700 chips are obtained from a one inch square wafer. Of course, the bigger the chip size, the fewer the number of chips which can be obtained from a given semiconductor wafer. Consequently, the unit cost of the chips is commensurately higher. At first blush it would appear that the straightforward solution to the problem is simply to scale down all of the dimensions of the device. This approach, however, is impractical because the annular contact also serves as a bonding pad for a wire bond. Reducing the chip size thus reduces the area of the bonding pad, making the wire bond operation a difficult and low yield process. Also, reducing the dot contact diameter increases the current density and hence degrades the reliability of the device.

SUMMARY OF THE INVENTION

We have found a simple, but elegant solution which reduces the chip area of surface-emitting LEDs without requiring a commensurate scale-down of the dot contact which defines the size of the light-emitting spot and provides the metalization area used for wire bonding. In our LED, the dot contact is positioned asymmetrically toward one corner of the chip, instead of being positioned centrally. In addition, rather than an annular shape, the electrical contact on the output surface, which also serves as the bonding pad, preferably has the general shape of an L, and the light output emerges from between the legs of the L.

For LEDs with essentially identical design criteria, our design illustratively achieves a reduction in chip area by a factor of more than two (e.g., 200 square mils compared to 480 square mils) and a corresponding decrease in unit cost.

BRIEF DESCRIPTION OF THE DRAWING

Our invention, together with its various features and advantages, can be readily understood from the following, more detailed description taken in conjunction with the accompanying drawing. In the interests of clarity the figures are not drawn to scale.

FIG. 1 is a partially cut away, isometric view of a surface-emitting LED in accordance with one embodiment of our invention; and FIG. 2 is a magnified, cross-sectional view of the dot contact, heterostructure and lens of FIG. 1.

DETAILED DESCRIPTION

With reference now to the figures, a surface emitting LED chip 10 has the general form of a parallelipiped having, typically, square, parallel major surfaces 12 and 14. Surface 12 is herein called the output surface because the light beam output $\lambda$ emerges from it. In accordance with our invention, means are provided for causing the light beam $\lambda$ to emerge from a spot which is asymmetrically positioned on the surface; i.e., toward one corner. More specifically, a dot-shaped electrical contact 16 is formed on the opposite major surface 14, and an optional, approximately hemispherical, integral lens 18 is formed in output surface 12. The dot contact 16 and the lens 18 are essentially in registration with one another and are asymmetrically positioned toward one corner of chip 10. A broader area contact 19, preferably in the general shape of an L, is formed on output surface 12 so that the beam $\lambda$ emerges from between the legs of the L. Viewed in another way, the dot contact 16 is positioned in one quadrant of surface 14, and L-shaped contact 19 is positioned in the remaining three quadrants of surface 12. However, the L-shape is not critical. Other geometries are possible provided that the contact spreads the applied current over surface 12 and allows the light beam to emerge.

This chip design results in a reduction in chip area by more than a factor of two (2.4 has been realized) and corresponding decrease in LED unit cost. As compared with a conventional LED chip having an area of 480 square mils, one embodiment of our chip is only 200 sq. mils, which means that about 3900 chips can be obtained from a one inch square wafer instead of only about 1700 chips. This calculation assumes a kerf loss of about 2 mils on each side of a chip.

The LED also includes a semiconductor body which illustratively comprises a semiconductor substrate 20, a double heterostructure 22, and a contact-facilitating layer 24. The heterostructure 22 includes a relatively narrow bandgap active layer 26 sandwiched between a pair of opposite-conductivity-type, wider bandgap cladding layers 28 and 30. Contact-facilitating layer 24 is formed on cladding layer 30. A dot contact 16 is formed on layer 24, and the remainder of layer 24 is covered with a dielectric layer 32 before being bonded to heat sink 34.

All of the semiconductor layers may be epitaxially grown by a variety of well-known techniques such as, for example, liquid phase epitaxy (LPE) or metalloorganic chemical vapor deposition (MOCVD).

The conductivity-type of the active layer 26 is not critical, although a p-type layer may be desirable for high speed applications (e.g., above about 100 Mb/s) because it has a lower minority carrier lifetime than an n-type layer.

The composition of the active layer 26 depends upon the desired wavelength of operation. For long wavelength systems (e.g., $1.1-1.6$ μm), the active layer 26 is InGaAsP and the cladding layers 28 and 30 are InP. The contact-facilitating layer 24 has the same conductivity type as cladding layer 30 and illustratively comprises highly doped InGaAs or InGaAsP. The substrate 20 is InP which is transparent to the light generated in the InGaAsP active layer. Hence, the substrate remains a part of the end product. Indeed, the lens 18 is etched or otherwise formed in the substrate.

On the other hand, for shorter wavelength systems (e.g., 0.8–0.9 μm), the active layer 26 is $Al_xGa_{1-x}As$ with $0 \leq x \leq 0.1$ typically, and the cladding layers 28 and 30 are $Al_yGa_{1-y}As$ and $Al_zGa_{1-z}As$ with y, z>x and typically $0.20 \leq y,z \leq 0.40$. In this case, both the contact-facilitating layer and the substrate are GaAs. However, because a GaAs substrate would absorb light generated by the $Al_xGa_{1-x}As$ active layer, the substrate is removed and no integral lens need be employed.

EXAMPLE

This example describes a long wavelength InP/InGaAsP ($\lambda = 1.3$ μm) LED fabricated in accordance with our invention. Materials, compositions, dimensions and other parameters are provided by way of illustration only and, unless otherwise stated, are not intended to limit the scope of the invention.

Using LPE the following epitaxial layers were grown on a (100)-oriented InP substrate 20 thinned to about 100 μm and doped n-type with S to about $5 \times 10^{18}$ cm$^{-3}$: a 5 μm thick, InP cladding layer 28 doped n-type with Sn to about $1 \times 10^{18}$ cm$^{-3}$; a 1.5 μm thick, InGaAsP active layer 26 doped n-type with Sn to about $1 \times 10^{17}$ cm$^{-3}$; a 2 μm thick, InP cladding layer 30 doped p-type with Zn or Cd to about $5 \times 10^{18}$ cm$^{-3}$; and a 0.5 μm thick, InGaAsP contact-facilitating layer 24 doped p-type with Zn to about $1 \times 10^{19}$ cm$^{-3}$.

Electrical contacts were formed on the wafer as follows. The contact facilitating layer 24 and the substrate 20 were covered with suitable masks with openings corresponding to dot contacts 16 and L-shaped contacts 19, respectively. Au-Be dot contacts 16 (25 μm in diameter) were evaporated and alloyed onto the layer 24, and Au-Sn-Cr-Au L-shaped contacts (11 mil legs each about 5 mils wide) were evaporated and alloyed onto substrate 20. Au-Sn-Cr-Au contacts are described in the copending application of I. Camlibel et al., Ser. No. 521,443 filed on Aug. 8, 1983 and assigned to the assignee hereof (now U.S. Pat. No. 4,510,514 issued on Apr. 9, 1985.

The substrate 20 was masked and photoelectrochemical (PEC) etching was used to form the approximately hemispherical, integral lens 18 in a cylindrical cavity 21 of the substrate. PEC is well known and its use in making such lenses is described, for example, by R. H. Burton et al. in U.S. Pat. No. 4,415,414. Then, a $SiO_2$ dielectric layer 32 was plasma deposited over the remainder of layer 24. Openings were etched into layer 32 in registration with dot contacts 16. A Ti-Pd-Au adhesion layer (now shown) was evaporated over both the dielectric layer 32 and the dot contacts 16 before electroplating a 10–15 μm thick Au heat sink 34. Then, the wafer was diced by sawing into individual chips which measured about 14 mils square. About 3900 chips were obtained from a one inch square wafer. Finally, a 1 mil diameter Au wire 36 was bonded to the L-shaped contact 19 on each chip.

In operation, when such a chip is forward biased and driven by a current of about 150 mA, it generates about 3 mW of optical power at a wavelength of 1.3 μm and is capable of operating digitally at data rates up to about 90 Mb/s. For substantially higher bit rates the minority carrier lifetime in the active layer should be reduced by substituting, for example, a thinner (e.g. 0.5 μm), heavily doped, P-type InGaAsP layer for the n-type layer.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A light emitting diode comprising
   a semiconductor body which has essentially the shape of a parallelipiped having first and second opposing major surfaces, said body including an active layer for generating optical radiation in response to the flow of electrical current therethrough, and
   means for causing the radiation to emerge from said active layer and through said first major surface as a beam in a direction essentially orthogonal to said active layer,
   characterized in that
   said causing means for causing said beam to emerge from a region positioned in only one quadrant of said parallelipiped.

2. The diode of claim 1 wherein said causing means includes on said second major surface a dot-shaped electrical contact which is positioned in only said one quadrant of said parallelipiped.

3. The diode of claim 2 wherein said causing means includes on said first major surface a lens which is positioned essentially in registration with said dot contact.

4. The diode of claims 2 or 3 further including on said first major surface an L-shaped contact positioned so that said beam emerges from between the legs of the L.

5. The diode of claim 4 wherein said dot contact is positioned in said one quadrant and said L-shaped contact is positioned in the remaining three quadrants.

6. The diode of claims 1, 2 or 3 wherein said body includes a plurality of layers forming a double heterostructure.

7. The diode of claim 6 wherein said heterostructure comprises layers from the GaAs/AlGaAs materials system.

8. The diode of claim 6 wherein said heterostructure comprises layers from the InP/InGaAsP materials system.

9. A light emitting diode comprising a Group III-V compound semiconductor body which has essentially the shape of a square parallelipiped having first and second parallel major surfaces, said body including a double heterostructure which comprises a pair of opposite-conductivity-type cladding layers and an active layer sandwiched therebetween and essentially lattice-matched thereto, contact means for forward biasing said diode and for applying thereto electrical current which causes said active layer to generate optical radiation in the form of a beam which emerges through said first surface, said contact means comprising a dot contact formed on only one quadrant of said second surface, and an L-shaped contact formed on the remaining three quadrants of said first surface, and a heat sink thermally coupled to said diode through said second surface.

10. The diode of claim 9 further including a Group III-V compound substrate, said heterostructure being formed on one major surface thereof and the other major surface of said substrate being said first surface, said substrate having a cavity in said first surface and an integral lens formed at the bottom of said cavity in essential registration with said dot contact.

* * * * *